(12) United States Patent
Ho et al.

(10) Patent No.: US 10,143,108 B2
(45) Date of Patent: Nov. 27, 2018

(54) HEAT DISSIPATING DEVICE

(71) Applicant: COOLER MASTER CO., LTD., New Taipei (TW)

(72) Inventors: Chun-Ching Ho, New Taipei (TW); Hsin-Hung Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/705,278

(22) Filed: Sep. 15, 2017

(65) Prior Publication Data

US 2018/0146575 A1 May 24, 2018

(30) Foreign Application Priority Data

Nov. 21, 2016 (TW) .............................. 105138062 A

(51) Int. Cl.
*H05K 7/20* (2006.01)
*G06F 1/20* (2006.01)

(52) U.S. Cl.
CPC ........... *H05K 7/20218* (2013.01); *G06F 1/20* (2013.01); *H05K 7/20254* (2013.01)

(58) Field of Classification Search
CPC ................................................. H05K 7/20218
USPC .......................... 361/679.31, 679.52, 679.54
See application file for complete search history.

(56) References Cited

U.S. PATENT DOCUMENTS 8,570,744 B2 * 10/2013 Rau ........................... G06F 1/20
361/679.52

* cited by examiner

*Primary Examiner* — Mukund G Patel
(74) *Attorney, Agent, or Firm* — Locke Lord LLP; Tim Tingkang Xia, Esq.

(57) ABSTRACT

In a heat dissipating device adapted to a plurality of memory modules, a base surrounds the memory modules and has two long edges parallel to the memory modules, a first short edge and a second short edge. A plurality of heat conducting members of a comb-shaped frame extends from a heat dissipating wall connected to the first short edge to the second short edge. The heat conducting members are arranged side by side to form a plurality of receiving spaces for receiving the memory modules. A cover is pivotally connected to the comb-shaped frame and can rotate with respect to a first axis parallel to the first short edge. A movable portion is fixed with the comb-shaped frame and two resilient wings of the cover push two outmost heat conducting members inwardly, such that the heat conducting members and the memory modules abut against each other tightly.

12 Claims, 8 Drawing Sheets

HEAT DISSIPATING DEVICE

BACKGROUND OF THE INVENTION

1. Field of the Invention

The invention relates to a heat dissipating device and, more particularly, to a heat dissipating device adapted to a plurality of memory modules installed on a main board.

2. Description of the Prior Art

The temperatures of electronic components and memory modules in a computer will increase when the computer is operating. Therefore, it needs to dispose a heat dissipating device to reduce the temperatures of the electronic components and memory modules, such that the computer can operate normally. Taking a fan disposed around a main board for example, heat generated by the main board is guided away from the main board by the fan, so as to reduce the temperature.

Furthermore, in order to process huge data, the main board of a server has to be equipped with a plurality of memory modules side by side, so as to satisfy calculation requirement. However, no heat dissipating device can be disposed around the memory modules to reduce the temperature of the memory modules. Accordingly, it needs to provide a heat dissipating device for reduce the temperature of the memory modules installed on the main board side by side.

SUMMARY OF THE INVENTION

Therefore, an objective of the invention is to provide a heat dissipating device to solve the aforesaid problems.

According to an embodiment of the invention, a heat dissipating device is adapted to a plurality of memory modules installed on a main board side by side. The heat dissipating device comprises a base, a comb-shaped frame and a cover. The base surrounds the memory modules and has two long edges, a first short edge and a second short edge. The two long edges are opposite to each other and extend in a length direction of the memory modules. The first short edge and the second short edge are connected to ends of the two long edges. The comb-shaped frame is connected to the base and used for receiving the memory modules. The comb-shaped frame comprises a heat dissipating wall and a plurality of heat conducting members. The heat dissipating wall is connected to the first short edge of the base. The heat conducting members extend from the heat dissipating wall toward the second short edge in the length direction of the memory modules. The heat conducting members are arranged side by side. The heat conducting members and the heat dissipating wall form a comb-shaped structure with a plurality of receiving spaces for receiving the memory modules. The cover comprises a main body and at least one clamping structure. The main body has a positioning portion and a movable portion. The positioning portion is pivotally connected to the comb-shaped frame and adjacent to a top end of the heat dissipating wall. The movable portion is opposite to the positioning portion and capable of rotating with respect to a first axis parallel to the first short edge and passing through the positioning portion, such that the movable portion can be selectively fixed with or separated from the comb-shaped frame. The at least one clamping structure is located between the positioning portion and the movable portion and comprises two resilient wings. The resilient wings are connected to opposite edges of the main body corresponding to the long edges of the base and extend toward the base. The resilient wings push two outmost heat conducting members of the comb-shaped frame inwardly when the movable portion of the cover is fixed with the comb-shaped frame, such that the heat conducting members and the memory modules located between the heat conducting members abut against each other.

According to another embodiment of the invention, each of the heat conducting members of the comb-shaped frame has a protruding portion extending toward the second short edge. The cover has an engaging retainer, wherein the engaging retainer is connected to the main body, located at the movable portion, and extends from the main body toward the base. The engaging retainer has at least two separating portions and at least one receiving groove. Each of the separating portions has a predetermined width. The receiving groove is formed between two of the separating portions and used for receiving the protruding portion of the heat conducting member. The protruding portion of the heat conducting member is disposed in the receiving groove of the engaging retainer when the movable portion of the cover is fixed with the comb-shaped frame, such that the protruding portions of the heat conducting members are separated from each other by the predetermined width.

According to another embodiment of the invention, each of the heat conducting members has a plate body and a thermal pad connected to the plate body and contacting the memory module.

According to another embodiment of the invention, each of the heat conducting members has a heat pipe disposed in the plate body.

According to another embodiment of the invention, the heat dissipating device comprises a liquid tube connected to the heat dissipating wall and used for containing a liquid.

According to another embodiment of the invention, the heat dissipating wall has at least three inserting sheets. Each of the heat conducting members has a plate body and a recess formed on the plate body. Each of the heat conducting members is engaged with one of the inserting sheets by the recess.

According to another embodiment of the invention, the main body of the cover has a plurality of slots extending in the length direction of the memory modules.

According to another embodiment of the invention, each of the resilient wings of the at least one clamping structure has at least one protruding rib extending toward the comb-shaped frame. The protruding ribs of the resilient wings push the two outmost heat conducting members of the comb-shaped frame inwardly when the cover is fixed with the comb-shaped frame.

According to another embodiment of the invention, the heat dissipating device comprises two clamping structures located adjacent to the movable portion of the main body and located at the middle portion of the main body in a length direction, respectively.

According to another embodiment of the invention, each of the resilient wings of the at least one clamping structure has a step portion extending toward the comb-shaped frame. The step portions of the resilient wings push the two outmost heat conducting members of the comb-shaped frame inwardly when the movable portion of the cover is fixed with the comb-shaped frame.

According to another embodiment of the invention, the at least one clamping structure is located adjacent to the movable portion of the main body.

According to another embodiment of the invention, each of the receiving grooves of the engaging retainer of the cover has a triangular hole.

The invention at least has some features mentioned in the following. Since the receiving spaces of the comb-shaped frame receive the memory modules and the cover is capable of rotating with respect to the first axis, the movable portion of the cover can be fixed with the comb-shaped frame and the resilient wings of the cover can push two outmost heat conducting members of the comb-shaped frame inwardly, such that the heat conducting members and the memory modules can abut against each other tightly. Accordingly, the heat will be conducted to the heat dissipating wall through the heat dissipating members by a contact-conducting manner when the temperatures of the memory modules increase, so as to reduce the temperatures of the memory modules. Furthermore, the cover can rotate away from the comb-shaped frame to separate the resilient wings from the comb-shaped frame, such that the heat conducting members and the memory modules do not abut against each other tightly. Consequently, the memory modules can be removed from the receiving spaces easily.

These and other objectives of the present invention will no doubt become obvious to those of ordinary skill in the art after reading the following detailed description of the preferred embodiment that is illustrated in the various figures and drawings.

DETAILED DESCRIPTION

Before the invention is described, it should be noted that similar elements are labeled by the same numerals in the following embodiments.

Figure 1:
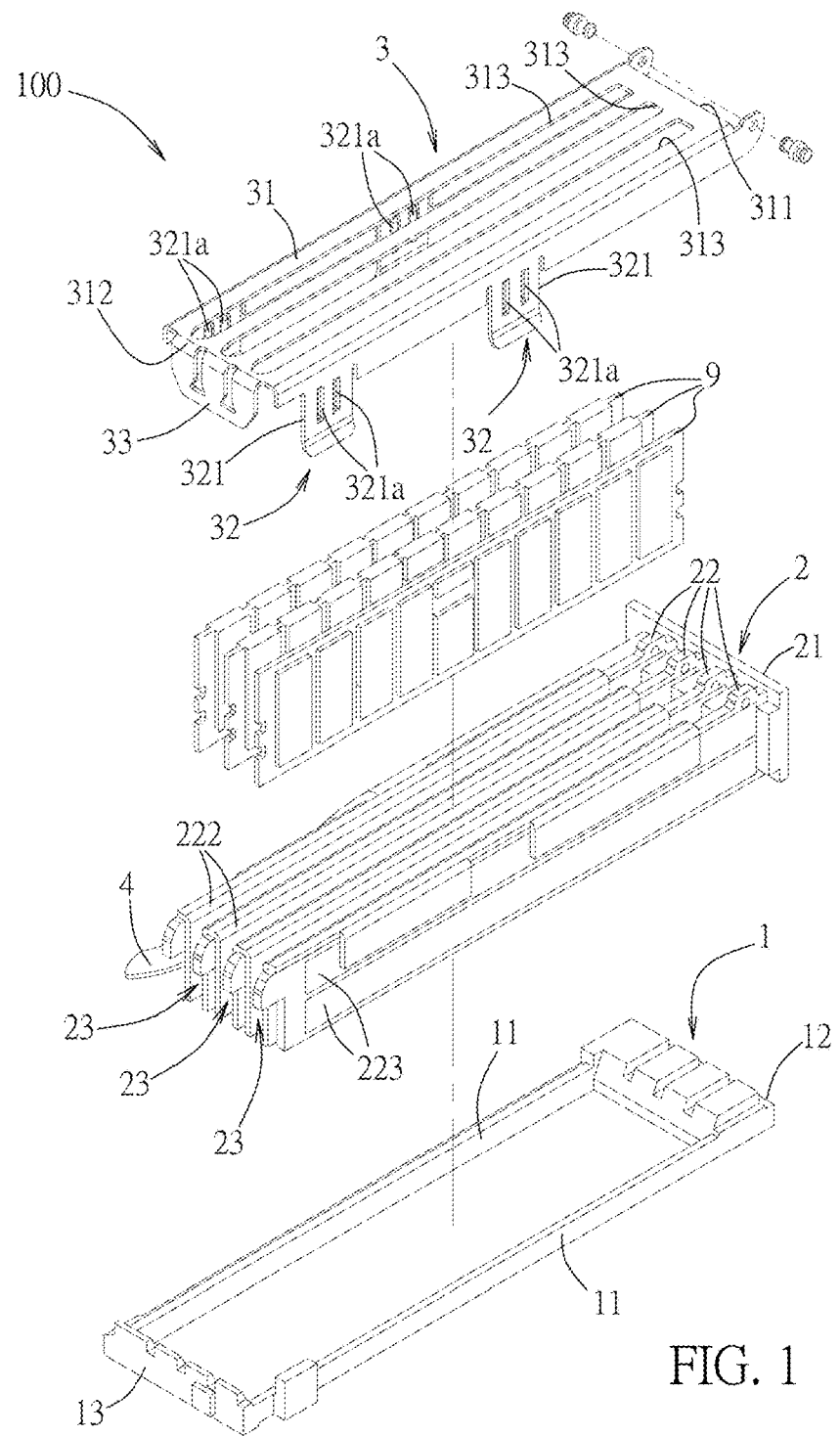
FIG. 1 is an exploded view illustrating a heat dissipating device according to a first embodiment of the invention.
Figure 2:
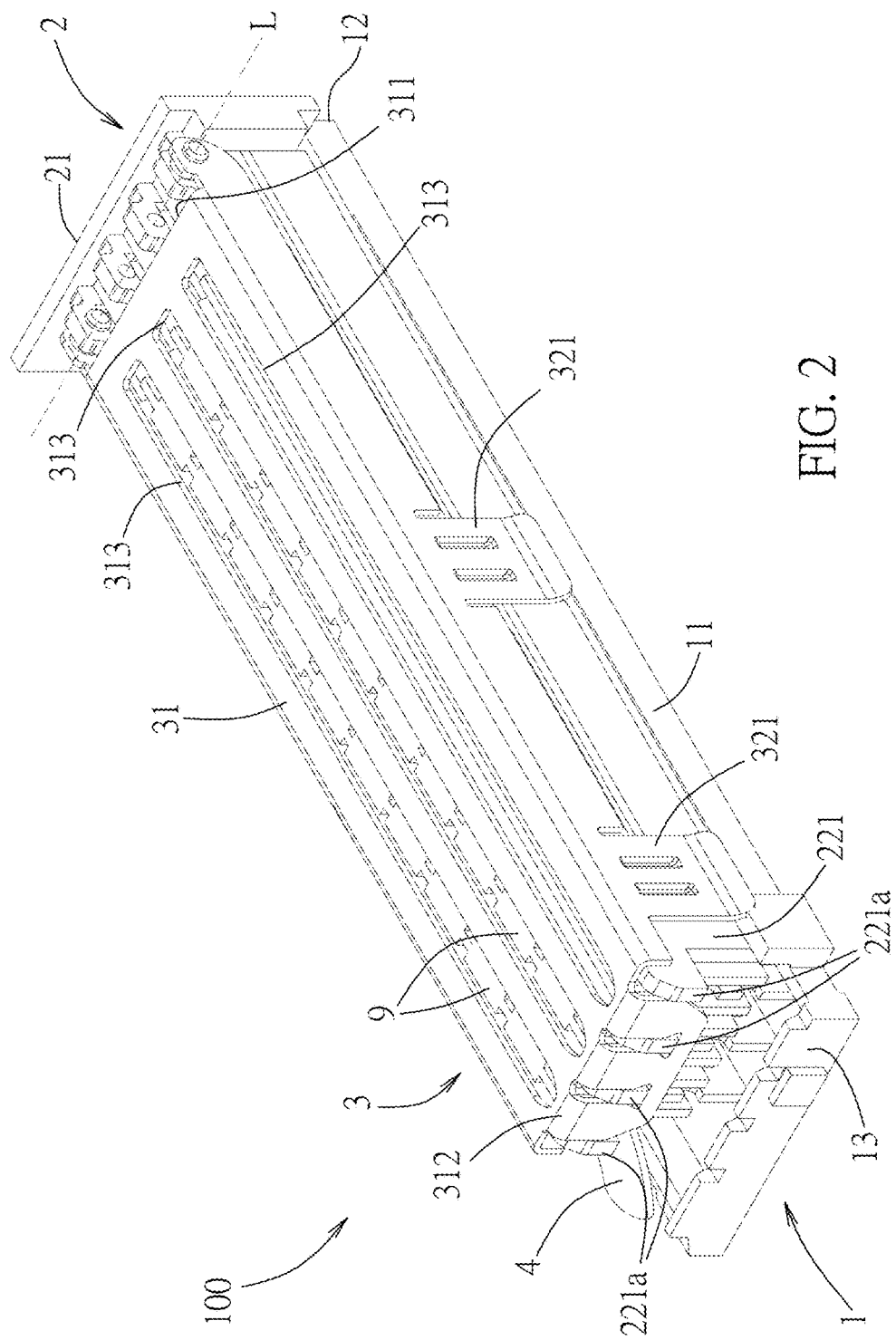
FIG. 2 is a perspective view illustrating the first embodiment.

Referring to FIGS. 1 and 2, a heat dissipating device 100 of a first embodiment of the invention is, for example, adapted to a plurality of memory modules 9 installed on a main board (not shown) side by side, but is not so limited. The heat dissipating device 100 comprises a base 1, a comb-shaped frame 2, a cover 3 and a liquid tube 4 connected to the comb-shaped frame 2 and used for containing a liquid, but is not so limited. In this embodiment, the number of the memory modules 9 may be, but not limited to, 3.

The base 1 surrounds the memory modules 9 and has two long edges 11, a first short edge 12 and a second short edge 13. The two long edges 11 are opposite to each other and extend in a length direction of the memory modules 9. The first short edge 12 and the second short edge 13 are connected to ends of the two long edges 11.

The comb-shaped frame 2 is connected to the base 1 and used for receiving the memory modules 9. The comb-shaped frame 2 comprises a heat dissipating wall 21 and a plurality of heat conducting members 22, wherein the number of the heat conducting members 22 may be, but not limited to, 4. The heat dissipating wall 21 is connected to the first short edge 12 of the base 1. The heat conducting members 22 are connected to the heat dissipating wall 21. The heat conducting members 22 extend from the heat dissipating wall 21 toward the second short edge 13 in a length direction of the memory modules 9. The heat conducting members 22 are arranged side by side. The heat conducting members 22 and the heat dissipating wall 21 form a comb-shaped structure with a plurality of receiving spaces 23 for receiving the memory modules 9. The number of the heat conducting members 22 is not limited to this embodiment. In other embodiments, the number of the heat conducting members 22 may be two or more than two.

Figure 3:
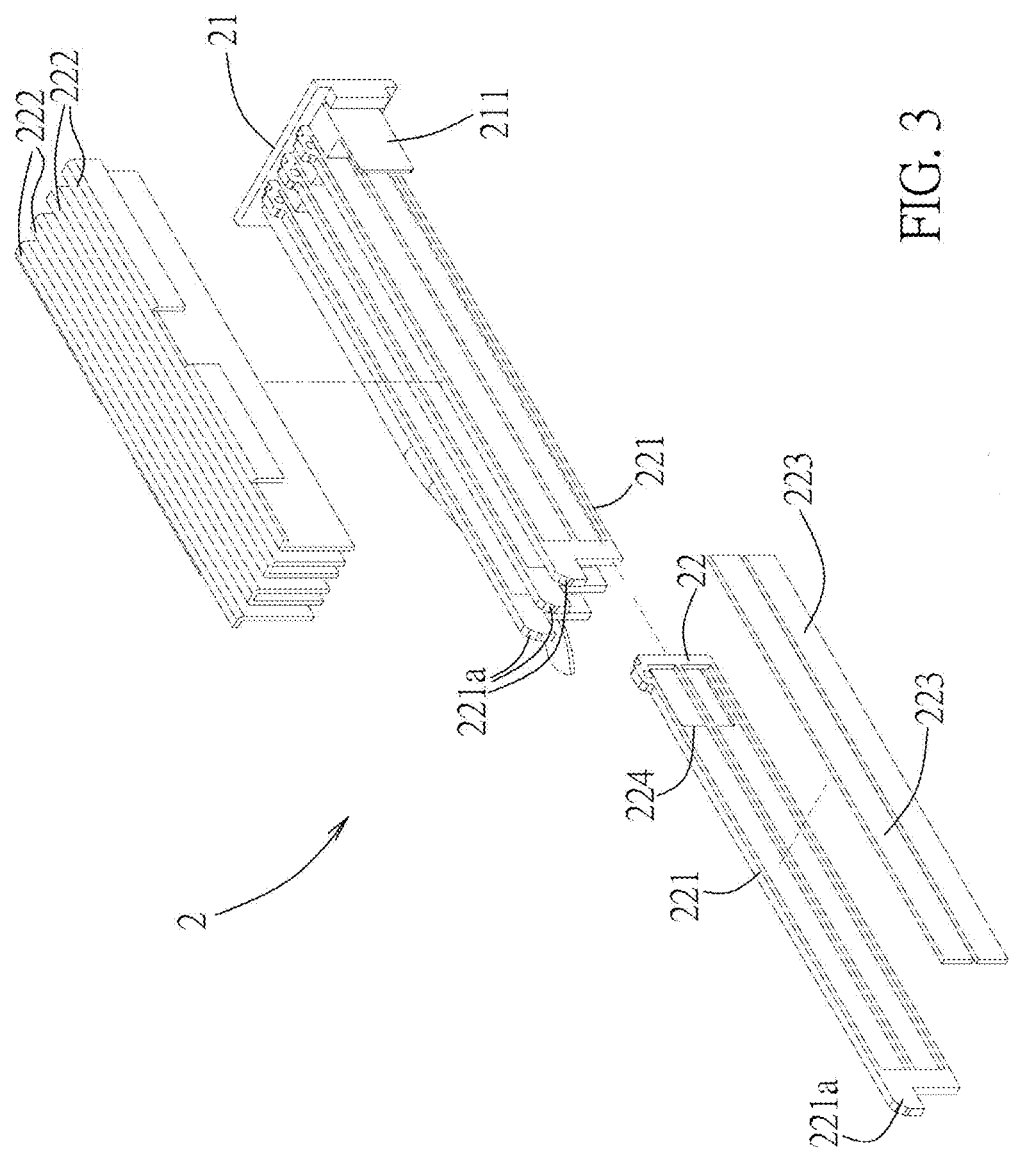
FIG. 3 is a partial exploded view illustrating a comb-shaped frame of the first embodiment.

Referring to FIG. 3, in this embodiment, the heat dissipating wall 21 has four inserting sheets 211, wherein FIG. 3 only shows one of the inserting sheets 211. The inserting sheets 211 are separated from each other and extend toward the second short edge 13. Each of the heat conducting members 22 has a plate body 221, a thermal pad 222, two heat pipes 223 and a recess 224, but is not so limited. The thermal pad 222 is compressible, connected to the plate body 221 and used for contacting the memory modules 9. The heat pipes 223 are disposed in the plate body 221. The recess 224 is formed on the plate body 221. Each of the heat conducting members 22 is engaged with one of the inserting sheets 211 through the recess 224. In this embodiment, the plate body 221 may be, for example, rectangular and has a protruding portion 221a extending toward the second short edge 13 (see FIG. 2), but is not so limited.

Figure 4:
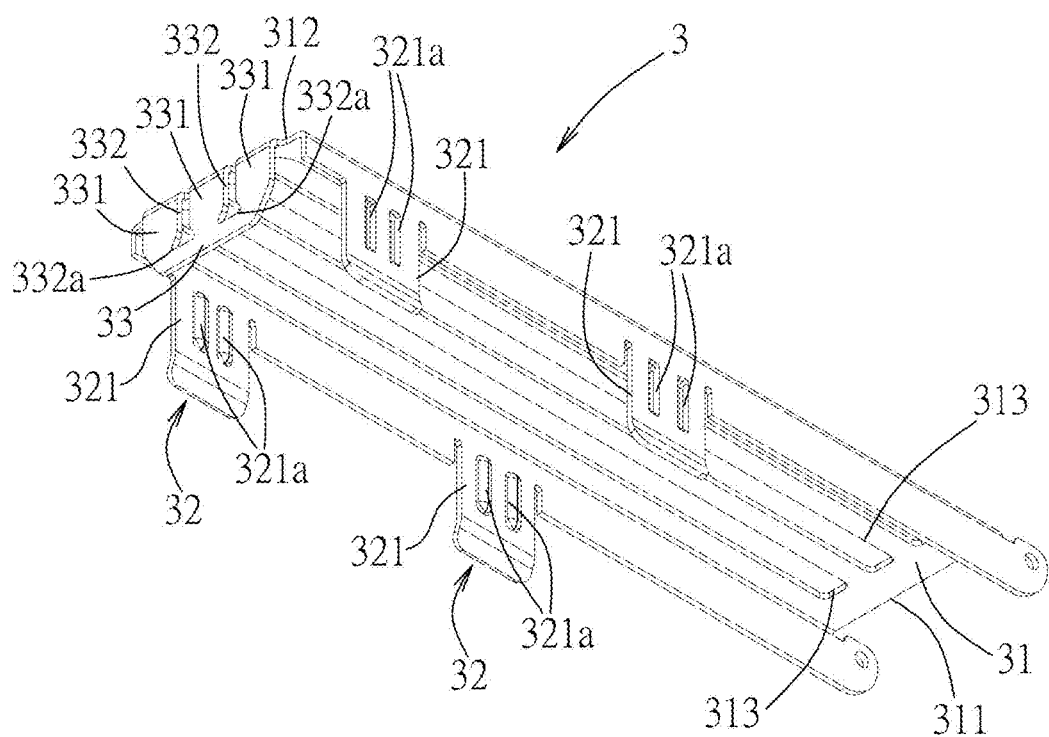
FIG. 4 is a perspective view illustrating a cover of the first embodiment.

Referring to FIG. 4, the cover 3 may comprise a main body 31, two clamping structures 32 and an engaging retainer 33. The number of the clamping structures 32 is not limited to this embodiment. In other embodiments, the number of the clamping structures 32 may be 1 or more than 2. In this embodiment, the main body 31 may be rectangular and, for example, may have a positioning portion 311, a movable portion 312 and three slots 313, but is not so limited. The positioning portion 311 is pivotally connected to the comb-shaped frame 2 and adjacent to a top end of the heat dissipating wall 21. The movable portion 312 is opposite to the positioning portion 311. The slots 313 extend in the length direction of the memory modules 9. The number of the slots 313 is not limited to this embodiment. In this embodiment, the positioning portion 311 of the main body 31 may be pivotally connected to two outmost heat conducting members 22, but is not so limited. It should be noted that the slots 313 are conducive to dissipate heat from the memory modules 9, reduce weight of the main body 31, and avoid structural interference. In this embodiment, the cover 3 is pivotally connected to the comb-shaped frame 2, but is not so limited.

The two clamping structures 32 may be located between the positioning portion 311 and the movable portion 312 of the main body 31. In this embodiment, the two clamping structures 32 may be located adjacent to the movable portion 312 of the main body 31 and located at the middle portion of the main body 31 in a length direction, respectively, but are not so limited. Each of the clamping structure 32 comprises two resilient wings 321. The resilient wings 321 are connected to opposite edges of the main body 31 corresponding to the long edges 11 and extend toward the base 1. Each of the resilient wings 321 has two protruding ribs 321*a* extending toward the comb-shaped frame 2. However, the number of the protruding ribs 321*a* is not limited to this embodiment.

The engaging retainer 33 of the cover 3 is connected to the main body 31, located at the movable portion 312, and extends from the main body 31 toward the comb-shaped frame 2. The engaging retainer 33 has three separating portions 331 and two receiving grooves 332 formed thereon. Each of the separating portions 331 has a predetermined width d (see FIG. 6). Each of the receiving grooves 332 is formed between two of the separating portions 331. The number of the separating portions 331 and the number of the receiving grooves 332 are not limited to this embodiment. In this embodiment, each of the receiving grooves 332 has a triangular hole 332*a*, but is not so limited.

Figure 5:
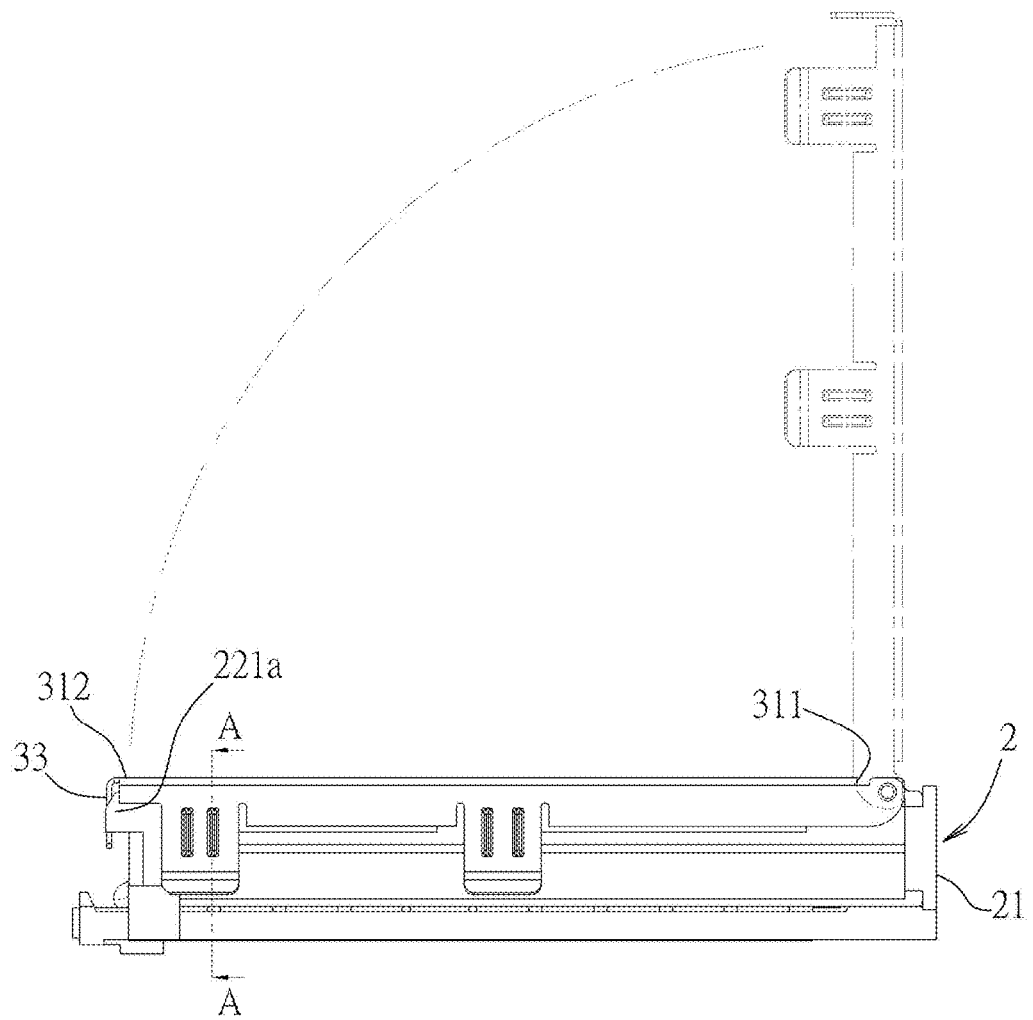
FIG. 5 is a front view illustrating the rotation of the cover of the first embodiment.
Figure 6:
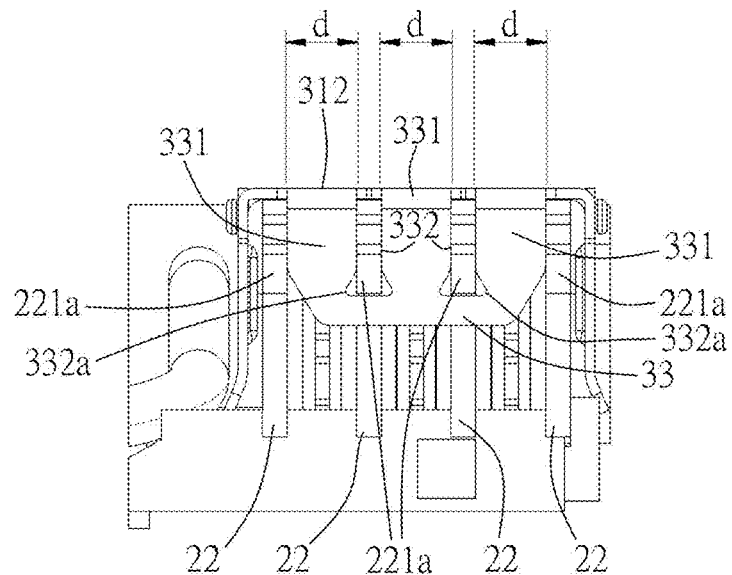
FIG. 6 is a side view illustrating the cover fixed with the comb-shaped frame of the first embodiment.

Referring to FIG. 5, in this embodiment, the main body 31 of the cover 3 is capable of rotating with respect to a first axis L (see FIG. 2) parallel to the first short edge 12 and passing through the positioning portion 311, such that the movable portion 312 can be selectively fixed with or separated from the protruding portions 221*a* of the comb-shaped frame 2. Referring to FIGS. 2 and 6, in this embodiment, the protruding portions 221*a* of two heat conducting members 22 located at the middle are disposed in the receiving grooves 332 of the engaging retainer 33 when the movable portion 312 of the cover 31 is fixed with the comb-shaped frame 2. In other words, the movable portion 312 is fixed with the comb-shaped frame 2 through the engaging retainer 33, but is not so limited. In other embodiments, the cover 3 may be fixed with the comb-shaped frame 2 through other structures according to practical application. For example, the invention may dispose an engaging hook and an engaging ring on the cover 3 and the comb-shaped frame 2, respectively, and that is included in the scope of the invention. In this embodiment, when the protruding portions 221*a* of the two heat conducting members 22 located at the middle are disposed in the receiving grooves 332 of the engaging retainer 33, the three separating portions 331 with the predetermined width d are located between the protruding portions 221*a* of the heat conducting members 22, such that the protruding portions 221*a* of the heat conducting members 22 are separated from each other by the predetermined width d. It should be noted that when the memory modules 9 are received in the receiving spaces 23, the heat conducting members 22 may be pushed by the memory modules 9 to shift. Under the aforesaid situation, two inclined edges of the triangular hole 332*a* of each receiving groove 332 may guide the protruding portion 221*a* of the shifted heat conducting member 22 to original position while the cover 3 is being fixed with the comb-shaped frame 2. Then, a bottom edge of the triangular hole 332*a* is engaged with the protruding portion 221*a* longitudinally.

Figure 7:
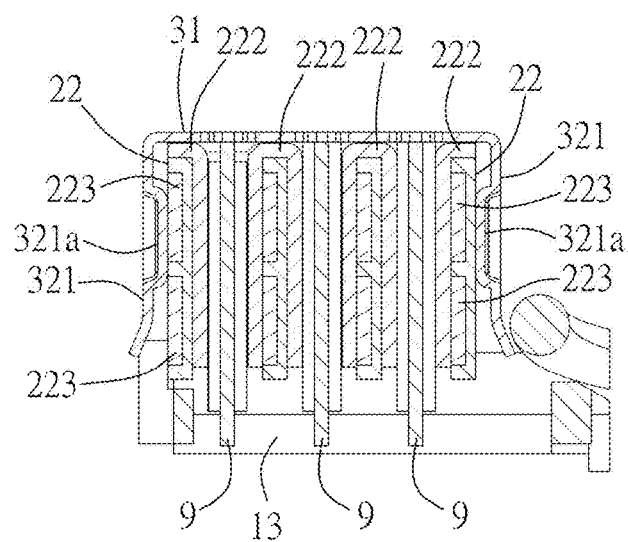
FIG. 7 is a sectional view illustrating two resilient wings pushing the comb-shaped frame inwardly along line A-A shown in FIG. 5 according to the first embodiment.

At this time, referring to FIG. 7, the resilient wings 321 push two outmost heat conducting members 22 of the comb-shaped frame 2 inwardly, such that the heat conducting members 22 and the memory modules 9 located between the heat conducting members 22 abut against each other tightly. Accordingly, the heat will be conducted to the heat dissipating wall 21 through the thermal pads 222 and the heat pipes 223 of the heat dissipating members 22 by a contact-conducting manner when the temperatures of the memory modules 9 increase, so as to reduce the temperatures of the memory modules 9. It should be noted that, in this embodiment, the resilient wings 321 use the protruding ribs 321*a* to push the two outmost heat conducting members 22 of the comb-shaped frame 2 inwardly. Accordingly, the contact area between the resilient wings 321 and the two outmost heat conducting members 22 may be reduced.

Figure 8:
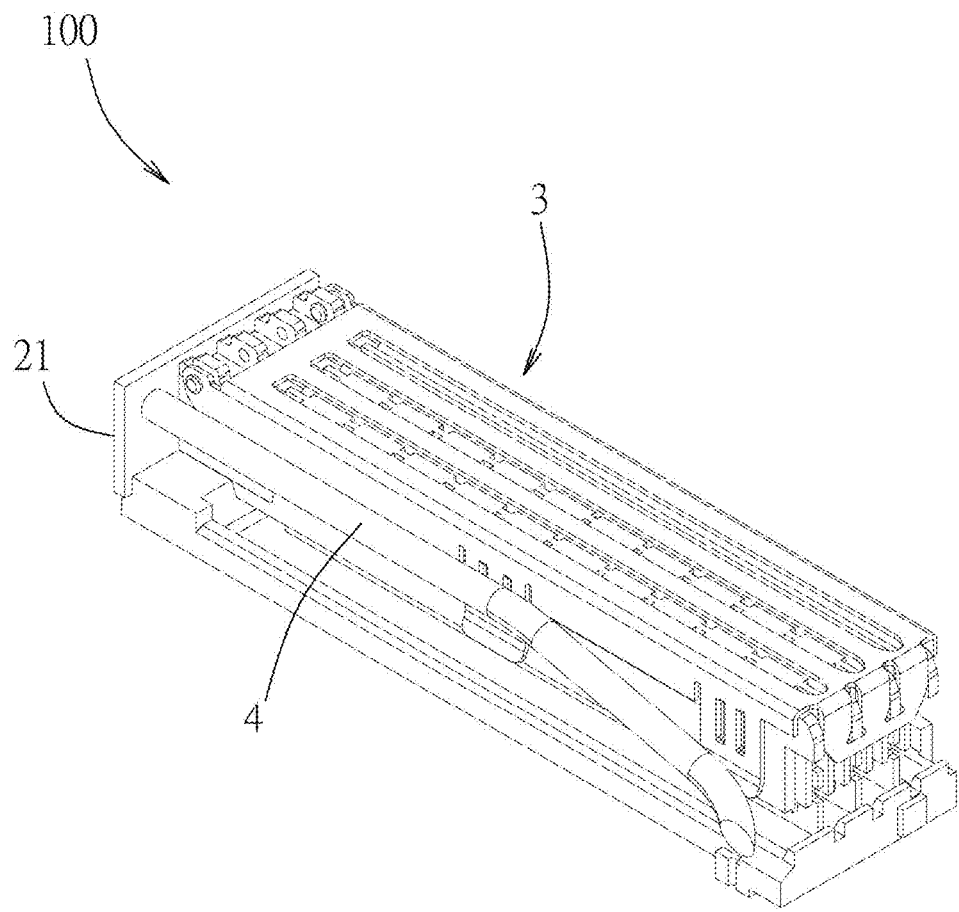
FIG. 8 is a perspective view illustrating the first embodiment from another viewing angle different from FIG. 4.

Referring to FIG. 8, in this embodiment, the liquid tube 4 is connected to the heat dissipating wall 21 and may communicate with a liquid passage (not shown) formed in a metal block (not shown) connected to the heat dissipating wall 21, such that a liquid may flow through the metal block by the liquid tube 4 and the liquid passage. Accordingly, when the heat conducting members 22 conduct heat from the memory modules 9 to the heat dissipating wall 21, the heat may be taken away from the heat dissipating wall 21 by the metal block and the liquid contained in the metal block. The liquid may coolant, water, cooling liquid, and so on.

Figure 9:
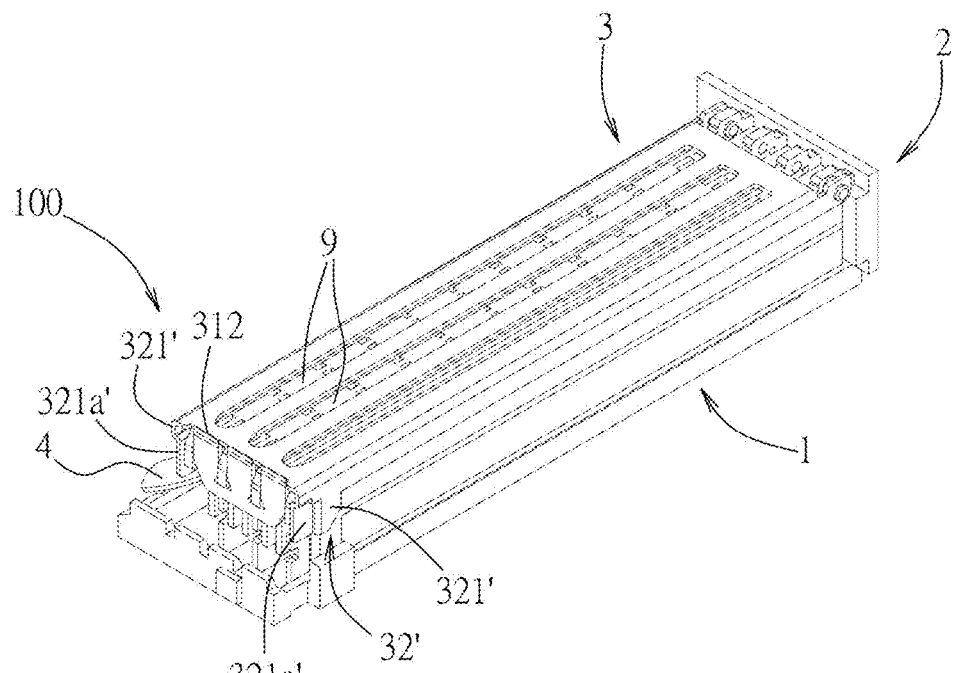
FIG. 9 is a perspective view illustrating a heat dissipating device according to a second embodiment of the invention.
Figure 10:
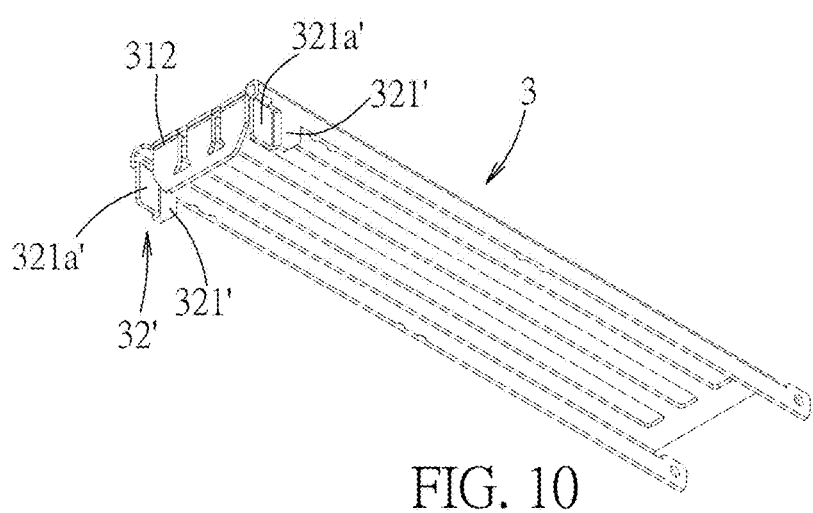
FIG. 10 is a perspective view illustrating a cover of the second embodiment.

Referring to FIGS. 9 and 10, the heat dissipating device 100 of a second embodiment of the invention is substantially identical to the aforesaid first embodiment. The main difference is that, in this embodiment, the cover 3 has only one clamping structure 32' and each of the resilient wings 321' of the clamping structure 32' has a step portion 321*a'* extending toward the comb-shaped frame 2. The step portions 321*a'* of the resilient wings 321' push the two outmost heat conducting members 22 of the comb-shaped frame 2 inwardly when the movable portion 312 of the cover 3 is fixed with the comb-shaped frame 2 through the engaging retainer 33. By means of the aforesaid manner, the heat conducting members 22 and the memory modules 9 located between the heat conducting members 22 can also abut against each other tightly.

As mentioned in the above, since the heat dissipating device 100 of the invention uses the receiving spaces 23 of the comb-shaped frame 8 to receive the memory modules 9 and the cover 3 is fixed with the comb-shaped frame 2, the resilient wings 321 can push two outmost heat conducting members 22 inwardly, such that the heat conducting members 22 and the memory modules 9 can abut against each other tightly. Accordingly, the heat will be conducted to the heat dissipating wall 21 through the thermal pads 222 and the heat pipes 223 of the heat dissipating members 22 by a contact-conducting manner when the temperatures of the memory modules 9 increase, so as to reduce the temperatures of the memory modules 9. Furthermore, the cover 3 can rotate away from the comb-shaped frame 2 to separate the resilient wings 321 from the comb-shaped frame 2, such that the heat conducting members 22 and the memory modules 9 do not abut against each other tightly. Consequently, the memory modules 9 can be removed from the receiving spaces 23 easily. Moreover, the resilient wings 321 use the protruding ribs 321*a* to push the two outmost heat conducting members 22 of the comb-shaped frame 2 inwardly. Accordingly, the contact area between the resilient wings 321 and the two outmost heat conducting members 22 may be reduced. Still further, by means of the separating portions 331 with the predetermined width d, the protruding portions 221*a* of the heat conducting members 22 can be separated from each other by the predetermined width d. Therefore, the objective of the invention can be achieved certainly.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A heat dissipating device adapted to a plurality of memory modules installed on a main board side by side, the heat dissipating device comprising:
   a comb-shaped frame comprising a heat dissipating wall and a plurality of heat conducting members, the heat conducting members being connected to the heat dissipating wall and arranged side by side, the heat conducting members and the heat dissipating wall forming a comb-shaped structure with a plurality of receiving spaces for receiving the memory modules;
   a cover selectively fixed with or separated from the comb-shaped frame, the cover comprising at least one clamping structure, the at least one clamping structure pushing two outmost heat conducting members of the comb-shaped frame inwardly when the cover is fixed with the comb-shaped frame, such that the heat conducting members and the memory modules located between the heat conducting members abut against each other tightly,
   wherein each of the heat conducting members of the comb-shaped frame has a protruding portion extending away from the heat dissipating wall; wherein the cover has an engaging retainer extending toward the comb-shaped frame, the engaging retainer has at least two separating portions and at least one receiving groove, each of the separating portions has a predetermined width, the receiving groove is formed between two of the separating portions and used for receiving the protruding portion of the heat conducting member; wherein the protruding portion of the heat conducting member is disposed in the receiving groove of the engaging retainer and the separating portions are located between the protruding portions of the heat conducting members when the cover is fixed with the comb-shaped frame, such that the protruding portions of the heat conducting members are separated from each other by the predetermined width.

2. The heat dissipating device of claim 1, further comprising a base surrounding the memory modules and connected to a bottom of the comb-shaped frame, the base having two long edges, a first short edge and a second short edge, the two long edges being opposite to each other and extending in a length direction of the memory modules, the first short edge and the second short edge being connected to ends of the two long edges.

3. The heat dissipating device of claim 1, further comprising a liquid tube connected to the heat dissipating wall and used for containing a liquid.

4. The heat dissipating device of claim 1, wherein the at least one clamping structure of the cover comprises two resilient wings and the resilient wings push the two outmost heat conducting members of the comb-shaped frame inwardly when the cover is fixed with the comb-shaped frame.

5. The heat dissipating device of claim 4, wherein each of the resilient wings of the at least one clamping structure has at least one protruding rib extending toward the comb-shaped frame; wherein the protruding ribs of the resilient wings push the two outmost heat conducting members of the comb-shaped frame inwardly when the cover is fixed with the comb-shaped frame.

6. The heat dissipating device of claim 4, wherein each of the resilient wings of the at least one clamping structure has a step portion extending toward the comb-shaped frame; the step portions of the resilient wings push the two outmost heat conducting members of the comb-shaped frame inwardly when the cover is fixed with the comb-shaped frame.

7. A heat dissipating device comprising:
   a comb-shaped frame comprising a heat dissipating wall and a plurality of heat conducting members, the heat conducting members being arranged side by side, the heat conducting members and the heat dissipating wall forming a comb-shaped structure with a plurality of receiving spaces; and
   a cover selectively fixed with or separated from the comb-shaped frame, the cover comprising at least one clamping structure, the at least one clamping structure pushing two outmost heat conducting members of the comb-shaped frame inwardly when the cover is fixed with the comb-shaped frame,
   wherein each of the heat conducting members of the comb-shaped frame has a protruding portion extending away from the heat dissipating wall; wherein the cover has an engaging retainer extending toward the comb-shaped frame, the engaging retainer has at least two separating portions and at least one receiving groove, each of the separating portions has a predetermined width, the receiving groove is formed between two of the separating portions and used for receiving the protruding portion of the heat conducting member; wherein the protruding portion of the heat conducting member is disposed in the receiving groove of the engaging retainer and the separating portions are located between the protruding portions of the heat conducting members when the cover is fixed with the comb-shaped frame, such that the protruding portions of the heat conducting members are separated from each other by the predetermined width.

8. The heat dissipating device of claim 7, further comprising a base connected to a bottom of the comb-shaped frame, the base having two long edges, a first short edge and a second short edge, the two long edges being opposite to each other, the first short edges and the second short edges being connected to ends of the two long edges.

9. The heat dissipating device of claim 7, further comprising a liquid tube connected to the heat dissipating wall and used for containing a liquid.

10. The heat dissipating device of claim 7, wherein the at least one clamping structure of the cover comprises two resilient wings and the resilient wings push the two outmost heat conducting members of the comb-shaped frame inwardly when the cover is fixed with the comb-shaped frame.

11. The heat dissipating device of claim 10, wherein each of the resilient wings of the at least one clamping structure has at least one protruding rib extending toward the comb-shaped frame; wherein the protruding ribs of the resilient wings push the two outmost heat conducting members of the comb-shaped frame inwardly when the cover is fixed with the comb-shaped frame.

12. The heat dissipating device of claim 10, wherein each of the resilient wings of the at least one clamping structure has a step portion extending toward the comb-shaped frame; the step portions of the resilient wings push the two outmost heat conducting members of the comb-shaped frame inwardly when the cover is fixed with the comb-shaped frame.

* * * * *